United States Patent
Deng et al.

(10) Patent No.: US 11,533,818 B2
(45) Date of Patent: Dec. 20, 2022

(54) SENSOR ASSEMBLIES AND METHODS FOR EMULATING INTERACTION OF ENTITIES WITHIN WATER SYSTEMS

(71) Applicant: Battelle Memorial Institute, Richland, WA (US)

(72) Inventors: Z. Daniel Deng, Richland, WA (US); Jun Lu, Richland, WA (US); Jayson J. Martinez, Richland, WA (US); Aljon L. Salalila, Richland, WA (US); Mitchell J. Myjak, Richland, WA (US); Hongfei Hou, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 393 days.

(21) Appl. No.: 16/351,373

(22) Filed: Mar. 12, 2019

(65) Prior Publication Data
US 2020/0296854 A1    Sep. 17, 2020

(51) Int. Cl.
*G01L 19/14* (2006.01)
*H05K 7/14* (2006.01)
*G01R 33/00* (2006.01)

(52) U.S. Cl.
CPC .......... *H05K 7/1427* (2013.01); *G01L 19/148* (2013.01); *G01R 33/0047* (2013.01)

(58) Field of Classification Search
CPC ... H05K 7/1427; G01L 19/148; G01L 19/149; G01R 33/0047; G01R 33/0206;
(Continued)

(56) References Cited

U.S. PATENT DOCUMENTS

| 2,775,939 A | 1/1957 | Fogal |
| 3,100,886 A | 8/1963 | Marks |

(Continued)

FOREIGN PATENT DOCUMENTS

| CA | 2091043 | 6/1994 |
| CN | 1424592 | 6/2003 |

(Continued)

OTHER PUBLICATIONS

WO PCT/US2020/021744 Search Rept., dated Jun. 12, 2020, Battelle Memorial Institute.
(Continued)

*Primary Examiner* — Freddie Kirkland, III
(74) *Attorney, Agent, or Firm* — Wells St. John P.S.

(57) ABSTRACT

Sensor assemblies are provided for use in modeling water systems. These sensor assemblies can be used as sensor fish. These assemblies can include a circuit board supporting processing circuitry components on either or both opposing component support surfaces of the circuit board and a housing above the circuit board and the components, with the housing being circular about the circuit board in at least one cross section, and wherein the supporting surfaces of the circuit board are substantially parallel with the plane of the housing in the one cross section. Methods for emulating interaction of entities within water systems are provided. The methods can include introducing a sensor assembly into a water system. The sensor assembly can include: a circuit board supporting processing circuitry components on either or both of opposing component support surfaces of the circuit board; a housing about the circuit board and the components, the housing being circular about the circuit board in at least one cross section; and wherein the support surfaces of the circuit board are substantially parallel with the plane of the housing in the one cross section.

16 Claims, 8 Drawing Sheets

(58) Field of Classification Search
CPC ....... G01R 33/072; G01P 15/18; G01D 21/02; G01D 11/24
See application file for complete search history.

(56) References Cited

U.S. PATENT DOCUMENTS

| | | | |
|---|---|---|---|
| 3,262,093 | A | 7/1966 | Junger et al. |
| 3,292,303 | A | 12/1966 | Fora |
| 3,311,830 | A | 3/1967 | Skirvin |
| 3,575,732 | A | 4/1971 | Weidinger et al. |
| 3,713,086 | A | 1/1973 | Trott |
| 4,042,845 | A | 8/1977 | Hackett |
| 4,241,535 | A | 12/1980 | Tsukuda |
| 4,259,415 | A | 3/1981 | Tamura et al. |
| 4,336,709 | A | 6/1982 | Meek |
| 4,353,004 | A | 10/1982 | Kleinschmidt |
| 4,392,236 | A | 7/1983 | Sandstrom et al. |
| 4,679,559 | A | 7/1987 | Jefferts |
| 4,762,427 | A | 8/1988 | Hori et al. |
| 4,790,090 | A | 12/1988 | Sharber |
| 4,970,988 | A | 11/1990 | Heisey |
| 4,986,276 | A | 1/1991 | Wright |
| 5,177,891 | A | 1/1993 | Holt |
| 5,211,129 | A | 5/1993 | Taylor et al. |
| 5,324,940 | A | 6/1994 | Ekstrom |
| 5,344,357 | A | 9/1994 | Lyczek |
| 5,517,465 | A | 5/1996 | Nestler et al. |
| 5,675,555 | A | 10/1997 | Evans et al. |
| 5,697,384 | A | 12/1997 | Miyawaki et al. |
| 5,857,881 | A | 1/1999 | Zippel, Sr. |
| 5,974,304 | A * | 10/1999 | Chen ............... H04B 1/086 455/351 |
| 5,995,451 | A | 11/1999 | Evans et al. |
| 6,021,731 | A | 2/2000 | French et al. |
| 6,201,766 | B1 | 3/2001 | Carlson et al. |
| 6,662,742 | B2 | 12/2003 | Shelton et al. |
| 6,689,056 | B1 | 2/2004 | Kilcoyne et al. |
| 6,712,772 | B2 | 3/2004 | Cohen et al. |
| 6,766,950 | B2 * | 7/2004 | Hall ............... H05K 1/144 235/400 |
| 6,904,798 | B2 * | 6/2005 | Boucher ............ G10K 11/006 73/170.02 |
| 6,928,765 | B2 | 8/2005 | Brickett |
| 7,016,260 | B2 | 3/2006 | Baray |
| 7,289,931 | B2 | 10/2007 | Ebert |
| 7,457,720 | B2 | 11/2008 | Ebert |
| 8,032,429 | B2 | 10/2011 | Shafer |
| 8,033,890 | B2 | 10/2011 | Warner et al. |
| 8,360,327 | B2 | 1/2013 | Clarke |
| 8,448,592 | B2 | 5/2013 | Crowell et al. |
| 8,564,985 | B2 | 10/2013 | van Straaten |
| 8,922,373 | B2 | 12/2014 | Michelson |
| 9,266,591 | B2 | 2/2016 | Lu |
| 9,453,854 | B2 * | 9/2016 | Kraige ............... G01H 1/003 |
| 9,526,228 | B2 * | 12/2016 | Fraser ............... A01K 61/95 |
| 10,033,469 | B2 | 7/2018 | Deng et al. |
| 10,033,470 | B2 | 7/2018 | Deng et al. |
| 10,067,112 | B2 * | 9/2018 | Deng ............... G01N 33/1886 |
| 10,101,429 | B2 * | 10/2018 | Deng ............... A61B 5/0015 |
| 10,236,920 | B2 * | 3/2019 | Deng ............... A01K 11/008 |
| 10,452,143 | B2 * | 10/2019 | Moon ............... G06F 3/0346 |
| 10,531,639 | B2 * | 1/2020 | Deng ............... A01K 61/95 |
| 10,739,434 | B2 * | 8/2020 | Deng ............... H04B 1/034 |
| 11,104,404 | B2 * | 8/2021 | Wienders ............ B63B 22/00 |
| 11,181,544 | B2 * | 11/2021 | Ashmore ............. G01P 13/02 |
| 2003/0034887 | A1 | 2/2003 | Crabtree et al. |
| 2003/0085684 | A1 | 5/2003 | Tsukamoto et al. |
| 2003/0117893 | A1 | 6/2003 | Baray |
| 2003/0126847 | A1 | 7/2003 | Smith |
| 2004/0133081 | A1 | 7/2004 | Teller et al. |
| 2004/0220856 | A1 | 11/2004 | Moore |
| 2005/0158246 | A1 | 7/2005 | Takizawa et al. |
| 2006/0218374 | A1 | 9/2006 | Ebert |
| 2007/0083119 | A1 | 4/2007 | Adachi et al. |
| 2007/0088194 | A1 | 4/2007 | Tahar et al. |
| 2007/0103314 | A1 | 5/2007 | Giessler |
| 2007/0171012 | A1 | 7/2007 | Fujimori et al. |
| 2007/0288160 | A1 | 12/2007 | Ebert |
| 2008/0174409 | A1 | 7/2008 | Frank |
| 2008/0269614 | A1 | 10/2008 | Adachi et al. |
| 2009/0073802 | A1 | 3/2009 | Nizzola et al. |
| 2009/0079368 | A1 | 3/2009 | Poppen et al. |
| 2009/0182426 | A1 | 7/2009 | Von Arx et al. |
| 2009/0188320 | A1 | 7/2009 | Greenough et al. |
| 2009/0306633 | A1 | 12/2009 | Trovato et al. |
| 2011/0077659 | A1 | 3/2011 | Mandecki et al. |
| 2011/0105829 | A1 | 5/2011 | Ball |
| 2011/0163857 | A1 | 7/2011 | August et al. |
| 2011/0181399 | A1 | 7/2011 | Pollack et al. |
| 2011/0254529 | A1 | 10/2011 | van Straaten |
| 2012/0134239 | A1 * | 5/2012 | Struthers ............. H04B 1/034 367/137 |
| 2012/0277550 | A1 | 11/2012 | Rosenkranz et al. |
| 2013/0012865 | A1 | 1/2013 | Sallberg et al. |
| 2013/0181839 | A1 | 7/2013 | Cao |
| 2013/0237774 | A1 | 9/2013 | Schentag et al. |
| 2013/0324059 | A1 | 12/2013 | Lee et al. |
| 2014/0005758 | A1 | 1/2014 | Ben-Yehuda et al. |
| 2014/0142556 | A1 | 5/2014 | Kuo et al. |
| 2014/0211594 | A1 | 7/2014 | Allen et al. |
| 2015/0063072 | A1 | 3/2015 | Deng et al. |
| 2015/0241463 | A1 * | 8/2015 | Kraige ............... G01H 1/003 73/514.29 |
| 2015/0241566 | A1 | 8/2015 | Chakraborty et al. |
| 2015/0289479 | A1 | 10/2015 | Allen et al. |
| 2015/0351365 | A1 | 12/2015 | Claver Tallon et al. |
| 2016/0104355 | A1 * | 4/2016 | Alexander ......... G08B 25/016 340/693.1 |
| 2016/0211924 | A1 | 7/2016 | Deng et al. |
| 2016/0245894 | A1 * | 8/2016 | Deng ............... A61B 5/1112 |
| 2017/0089878 | A1 * | 3/2017 | Deng ............... G01N 33/1886 |
| 2017/0164581 | A1 | 6/2017 | Deng et al. |
| 2017/0170850 | A1 | 6/2017 | Deng et al. |
| 2018/0055007 | A1 | 3/2018 | Deng et al. |
| 2019/0018100 | A1 | 1/2019 | Deng et al. |
| 2019/0056372 | A1 | 2/2019 | Deng et al. |
| 2019/0103888 | A1 * | 4/2019 | Deng ............... A01K 99/00 |
| 2019/0250290 | A1 * | 8/2019 | Oeverland ........... H02H 9/04 |
| 2020/0079475 | A1 * | 3/2020 | Wienders ............ B63B 22/00 |
| 2020/0137980 | A1 | 5/2020 | Deng et al. |

FOREIGN PATENT DOCUMENTS

| | | |
|---|---|---|
| CN | 102568463 | 7/2012 |
| CN | 102598716 | 7/2012 |
| CN | 202414143 | 9/2012 |
| CN | 102754249 | 10/2012 |
| EP | 2037398 A1 | 3/2009 |
| EP | 1705500 B1 | 6/2010 |
| GB | 1195633 A | 6/1970 |
| GB | 2188028 A | 9/1987 |
| JP | 61-291294 | 12/1986 |
| WO | WO 95/03691 | 2/1995 |
| WO | WO 2011068825 | 6/2011 |
| WO | WO 2011/079338 | 7/2011 |
| WO | WO 2015/031853 | 3/2015 |

OTHER PUBLICATIONS

WO PCT/US2020/021744 Written Opin, dated Jun. 12, 2020, Battelle Memorial Institute.
Deng et al., U.S. Appl. No. 16/193,968, filed Nov. 16, 2018, titled "Methods for Attaching Transmitters to Animals", 51 pages.
Deng et al., U.S. Appl. No. 62/267,797, filed Dec. 15, 2015, titled "Signal Transmitter and Methods for Transmitting Signals from Animals", 34 pages.
CN 2015800768080 Search Report, dated Nov. 21, 2019, Battelle Memorial Institute.
CN 101714207 Abst. Full Ref., dated May 26, 2010, Byou Zhou. Brown, "Power Sources and Supplies", ISBN 978-7-5124-10527, Oct. 2013, China, 5 pages plus English translation.

(56) References Cited

OTHER PUBLICATIONS

China Electrical Appliance Industrial Institute, Editor of "Electrical and Electronic Technologies", Collection of Translations of Articles in 1992 International Electrical and Electronic Academic Conference, Nov. 1993, China, p. 540 plus English translation.
Deng et al., U.S. Appl. No. 16/726,574, filed Dec. 24, 2019, titled "Systems and Methods for Monitoring Organisms Within an Aquatic Environment", 49 pages.
WO PCT/US2017/038082 IPRP, dated Feb. 26, 2019, Battelle Memorial Institute.
CN CN 2014800479315 Search Rept, dated Jul. 26, 2017, BAttelle Memeorial Institute.
WO PCT/US2014/053578 IPRP, dated Mar. 1, 2018, Battelle Memorial Institute.
WO PCT/US2014/053578 Search Rept, dated Mar. 5, 2015, Battelle Memorial Institute.
WO PCT/US2014/053578 Writ Opin., dated Mar. 5, 2015, Battelle Memorial Institute.
WO PCT/US2015/062200 IPRP, dated Aug. 29, 2017, Battelle Memorial Insitute.
WO PCT/US2015/062200 Search Rept, dated Feb. 24, 2018, Battelle Memorial Institute.
WO PCT/US2015/062200 Writ Opin., dated Feb. 24, 2016, Battelle Memorial Institute.
WO PCT/US2018/054981 IPRP, dated Jun. 19, 2018, Battelle Memorial Institute.
WO PCT/US2016/054981 Search Rept., dated Nov. 18, 2016, Battelle Memorial Institute.
WO PCT/US2016/054981 Writ Opin., dated Nov. 18, 2016, Battelle Memorial Institute.
WO PCT/US2016/055045 IPRP, dated Aug. 19, 2018, Battelle Memorial Institute.
WO PCT/US2016/055045 Search Rept., dated Feb. 7, 2017, Battelle Memorial Institute.
WO PCT/US2016/055045 Writ Opin., dated Feb. 7, 2017, Battelle Memorial Institute.
WO PCT/US2017/038082 Inv Pay Fees, dated Sep. 15, 2017, Battelle Memorial Institue.
WO PCT/US2017/038082 Search Rept, dated Nov. 20, 2017, Battelle Memorial Institute.
WO PCT/US2017/038082 Writ. Opin, dated Nov. 20, 2017, Battelle Memorial Institute.
Aktakka et al., "Energy Scavenging from Insect Flight", Journal of Micromechanics and Microengineering vol. 21, 095016, 2011, United Kingdom, 10 pages.
Brown et al., "An Evaluation of the Maximum Tag Burden for Implantation of Acoustic Transmitters in Juvenile Chinook Salmon", North American Journal of Fisheries Management vol. 30, 2010, United States, pp. 499-505.
Cha et al., "Energy Harvesting from a Piezoelectric Biomimetic Fish Tail", Renewable Energy vol. 86, 2016, Netherlands, pp. 449-458.
Cha et al., "Energy Harvesting from the Tail Beating of a Carangiform Swimmer using Ionic Polymer-Metal Composites", Bioinspiration and Biomimetics vol. 8, 2013, United Kingdom, 15 pages.
Cook et al., "A Comparison of Implantation Methods for Large PIT Tags or Injectable Acoustic Transmitters in Juvenile Chinook Salmon", Fisheries Research vol. 154, 2014, Netherlands, pp. 213-223.
Dagdeviren et al., "Conformal Piezoelectric Energy Harvesting and Storage from Motions of the Heart, Lung, and Diaphragm", Proceedings of the National Academy of Sciences of the United States of America vol. 111, 2014, United States, pp. 1927-1932.
Deng et al., "A Cabled Acoustic Telemetry System for Detecting and Tracking Juvenile Salmon: Part 2. Three-Dimensional Tracking and Passage Outcomes", Sensors vol. 11, 2011, Switzerland, pp. 5661-5676.
Deng et al., "An Injectable Acoustic Transmitter for Juvenile Salmon", Scientific Reports, Jan. 29, 2015, United Kingdom, 6 pages.

Deng et al., "Design and Instrumentation of a Measurement and Calibration System for an Acoustic Telemetry System", Sensors vol. 10, 2010, Switzerland, pp. 3090-3099.
Deng et al., U.S. Appl. No. 16/056,185, filed Aug. 6, 2018, titled "Autonomous Sensor Fish to Support Advanced Hydropower Development". 36 pages.
Deng et al., U.S. Appl. No. 62/267,738, filed Dec. 16. 2015, titled "Transmitters for Animals and Methods for Transmitting from Animals", 42 pages.
Eppard, "Juvenile Salmon Acoustic Telemetry System JSATS", Dec. 14, 2011, URL: http://www.nwcouncil.org/media/23478/jsats.pdf, pp. 1-13.
Erturk et al.,"Underwater Thrust and Power Generation Using Flexible Piezoelectric Composites: An Experimental Investigation Toward Self-Powered Swimmer-Sensor Platforms", Smart Materials and Structures vol. 20, 125013, 2011, United Kingdom, 11 pages.
Hwang et al., "Self-Powered Deep Brain Stimulation via a Flexible PIMNT Energy Harvester", Energy and Environmental Science vol. 8, 2015, United Kingdom, pp. 2677-2684.
Lam et al., "Physical Characteristics and Rate Performance of $(CFx)n$ $(0.33<x<9,66)$ in Lithium Batteries". Journal of Power Sources vol. 153, 2006, Netherlands, pp. 354-359.
Li et al., "Energy Harvesting from Low Frequency Applications using Piezoelectric Materials", Applied Physics Reviews 1,041301, 2014, United States, 20 pages.
Li et al., "Piezoelectric Materials Used in Underwater Acoustic Transducers" Sensor Letters vol. 10(3/4), 2012, United States, pp. 679-697.
McMichael et al., "The Juvenile Salmon Acoustic Telemetry System: A New Tool", Fisheries vol. 35, No. 1, Jan. 1, 2010, United States, pp. 9-22.
Meduri et al., "Hybrid CVx-Ag2V4011 as a High-Energy, Power Density Cathode for Application in an Underwater Acoustic Microtransmitter", Electrochemistry Communications vol. 13, 2011, United Slates, pp. 1344-1348.
Ritchie et al., "Further Developments of Lithium/Polycarbon Monofluoride Envelope Cells", Journal of Power Sources vol. 96, 2001, Netherlands, pp. 180-183.
Rub et al., "Comparative Performance of Acoustic-Tagged and Passive Integrated Transponder-Tagged Juvenile Salmonids in the Columbia and Snake Rivers", U.S. Army Corps of Engineers, Portland District, Portland Oregon, 2007, United States, 163 pages.
S.M Corporation, "Macro Fiber Composite—MFC" Smart Material Brochure, United States, 8 pages.
Shafer, "Energy Harvesting and Wildlife Monitoring", available online at http://www.ofwim.org/wp-content/uploads/2014/11/ Shafer_keynote.pdf, 2014, 36 pages.
Weiland et al., "A Cabled Acoustic Telemetry System for Detecting and tracking Juvenile Salmon: Part 1. Engineering Design and Instrumentation", Sensors vol. 11, No. 12, Dec. 26, 2011, Switzerland, pp. 5645-5660.
Yazami et al., "Fluorinated Carbon Nanofibres for High Energy and High Power Densities Primary Lithium Batteries", Electrochemistry Communications vol. 9, 2007, Netherlands, pp. 1850-1855.
Zhang et al., "Enhancement of Discharge Performance of Li/CFx Cell by Thermal Treatment of CFx Cathode Material", Journal of Power Sources vol. 188, 2003, Netherlands, pp. 601-605.
Adams et al., "Effects of Surgically and Gastrically Implanted Radio Transmitters on Swimming Performance and Predator Avoidance of Juvenile Chinook Salmon (*Oncorhynchus tshawytscha*)", Canadian Journal of Fisheries and Aquatic Sciences 55, 1998, Canada, pp. 781-787.
Anglea et al., "Effects of Acoustic Transmitters on Swimming Performance and Predator Avoidance of Juvenile Chinook Salmon", North American Journal of Fisheries Management 24, 2004, United States, pp. 162-170.
Atlantic States Marine Fisheries Commission, "American Eel Benchmark Stock Assessment Report No. 12-01", May 2012, United States, 340 pages.
Bams, "Differences in Performance of Naturally and Artificially Propagated Sockeye Salmon Migrant Fry, as Measured With Swim- (56) References Cited

OTHER PUBLICATIONS ming and Predation Tests", Journal of the Fisheries Board of Canada 24(5), 1967, Canada, pp. 1117-1153.

Barbin et al., "Behaviour and Swimming Performance of Elvers of the American Eel, *Anguilla rostrata*, in an Experimental Flume", Journal of Fish Biology 45, 1994, United Kingdom, pp. 111-121.

Biopack Systems, Inc. Hardware Guide, 2013, 152 pages.

Boubee et al., "Downstream Passage of Silver Eels at a Small Hydroelectric Facility", Fisheries Management and Ecology vol. 13, 2006, United Kingdom, pp. 165-176.

Brett, "The Respiratory Metabolism and Swimming Performance of Young Sockeye Salmon", Journal of the Fisheries Board of Canada 21(5), 1964, Canada, pp. 1133-1226.

Brown et al., "Evidence to Challenge the "2% Rule" for Biotelemetry", North American Journal of Fisheries Management 19, 1999, United States, pp. 867-871.

Brown et al., "Survival of Seaward-Migrating PIT and Acoustic-Tagged Juvenile Chinook Salmon in the Snake and Columbia Rivers: An Evaluation of Length-Specific Tagging Effects", Animal Biotelemetry 1:8, 2013, United States, 13 pages.

Brown, "Design Considerations for Piezoelectric Polymer Ultrasound Transducers", IEEE Transactions on Ultrasonics, Ferroelectrics, and Frequency Control vol. 47, No. 6, Nov. 2000, United States, pp. 1377-1396.

Brown, "The Effects of Material Selection for Backing and Wear Protection/Quarter-Wave Matching of Piezoelectric Polymer Ultrasound Transducers", IEEE Ultrasonics Symposium, 2000, United States, pp. 1029-1032.

Butler et al., "A Tri-Modal Directional Modem Transducer", Oceans 2003 MTS/IEEE Conference, Sep. 22-26, 2003, United States, pp. 1554-1560.

Cada, "The Development of Advanced Hydroelectric Turbines to Improve Fish Passage Survival", Fisheries vol. 26, No. 9, Sep. 2001, United States, pp. 14-23.

Carlson et al., "Juvenile Salmon Acoustic Telemetry System Transmitter Downsize Assessment", Pacific Northwest National Laboratory, Richland, WA, 2010, United States, 30 pages.

Carlson et al., "Sensor Fish Characterization of Spillway Conditions at Ice Harbor Dam in 2004, 2005 and 2006", PNWD-3839 Final Report, Mar. 2008, United States, 95 pages.

Carlson et al., "The Sensor Fish—Making Dams More Salmon-Friendly", Sensors Online, Jul. 2004, United States, 7 pages.

Collins et al., "Intracoelomic Acoustic Tagging of Juvenile Sockeye Salmon: Swimming Performance, Survival, and Postsurgical Wound Healing in Freshwater and during a Transition to Seawater", Transactions of the American Fisheries Society 142, 2013, United States, pp. 515-523.

Cote et al., "Swimming Performance and Growth Rates of Juvenile Atlantic Cod Intraperitoneally Implanted with Dummy Acoustic Transmitters", North American Journal of Fisheries Management vol. 19, 1999, United States, pp. 1137-1141.

Counihan et al., "Influence of Externally Attached Transmitters on the Swimming Performance of Juvenile White Sturgeon", Transactions of the American Fisheries Society 128, 1999, United States, pp. 965-970.

Coutant, "Fish Behavior in Relation to Passage Through Hydropower Turbines: A Review", Transactions of the American Fisheries Society vol. 129, 2000, United States, pp. 351-380.

Deng et al., "Design and Implementation of a New Autonomous Sensor Fish to Support Advanced Hydropower Development", Review of Scientific Instruments vol. 85, 2014, United States, 6 pages.

Deng et al., "Evaluation of Fish-Injury Mechanisms During Exposure to Turbulent Shear Flow", Canadian Journal of Fisheries and Aquatic Sciences vol. 62, 2005, Canada, pp. 1513-1522.

Deng et al., "Six-Degree-of-Freedom Sensor Fish Design and Instrumentation", Sensors vol. 7, 2007, United States, pp. 3399-3415.

Deng et al., "Use of an Autonomous Sensor to Evaluate the Biological Performance of the Advanced Turbine at Wanapum Dam", Journal of Renewable and Sustainable Energy vol. 2, 2010, United States, 11 pages.

Deng et al., U.S. Appl. No. 16/143,273, filed Sep. 26, 2018, titled "Acoustic Transmission Device and Process for Tracking Selected Hosts", 49 pages.

Dillon, "Use and Calibration of the Internal Temperature Indicator", Microchip Technology Inc. AN1333, 2010, United States, 12 pages.

Dinwoodie, "Dual Output Boost Converter", Texas Instruments Application Report SLUA288, available online at http://www.ti.com/lit/an/slua288/slua288.pdf, Apr. 2003, 9 pages.

El Rifai et al., "Modeling of Piezoelectric Tube Actuators", Dspace@MIT: Innovation in Manufacturing Systems and Technology (IMST), 2004, Singapore, 9 pages.

Fisheries and Oceans Canada (DFO), "Recovery Potential Assessment of American Eel (*Anguilla rostrata*) in Eastern Canada ", Canadian Science Advisory Secretariat Science Advisory Report 2013/078, 2013, Canada, 65 pages.

Gallego-Juarez et al., "Experimental Study of Nonlinearity in Free Progressive Acoustic Waves in Air at 20 kHz", Journal de Physique, Colloques, 40 (C8), 1979, France, pp. 336-340.

Harnish et al., "A Review of Polymer-Based Water Conditioners for Reduction of Handling-Related Injury", Reviews in Fish Biology and Fisheries 21, 2011, Netherlands, pp. 43-49.

Janak et al., "The Effects of Neutrally Buoyant, Externally Attached Transmitters on Swimming Performance and Predator Avoidance of Juvenile Chinook Salmon", Transactions of the American Fisheries Society 141, 2012, United States, pp. 1424-1432.

Johnson et al., "A Digital Acoustic Recording Tag for Measuring the Response of Wild Marine Mammals to Sound", IEEE Journal of Oceanic Engineering vol. 28. No. 1, Jan. 2003, United Stales, pp. 3-12.

Kogan et al., "Acoustic Concentration of Particles in Piezoelectric Tubes: Theoretical Modeling of the Effect of Cavity Shape and Symmetry Breaking", The Journal of the Acoustical Society of America vol. 116, No. 4, 2004, United States, pp. 1967-1974.

Lewandowski et al., "In Vivo Demonstration of a Self-Sustaining, Implantable, Stimulated-Muscle-Powered Piezoelectric Generator Prototype", Annals of Biomedical Engineering vol. 37, No. 11, Nov. 2009, Netherlands, pp. 2390-2401.

Li et al., "Piezoelectric Materials used in Underwater Acoustic Transmitters", Sensor Letters vol. 10, 2012, United States, 65 pages.

MacGregor et al., "Recovery Strategy for the American Eel (*Anguilla rostrata*) in Ontario", Ontario Recovery Strategy Series, Prepared for Ontario Ministry of Natural Resources, Peterborough, Ontario, 2013, Canada, 131 pages.

McGrath et al., "Studies of Upstream Migrant American Eels at the Moses-Saunders Power Dam on the St. Lawrence River near Massena, New York", American Fisheries Society Symposium 33, 2003, United States, pp. 153-166.

Mesa et al., "Survival and Growth of Juvenile Pacific Lampreys Tagged with Passive Integrated Transponders (PIT) in Freshwater and Seawater", Transactions of the American Fisheries Society 141, 2012, United States, pp. 1260-1268.

Mueller et al., "Tagging Juvenile Pacific Lamprey with Passive Integrated Transponders: Methodology, Short-Term Mortality, and Influence on Swimming Performance", North American Journal of Fisheries Management vol. 26, 2006, United States, pp. 361-366.

Normandeau, "Survey for Upstream American Eel Passage at Holyoke Dam, Connecticut River, Massachusetts, 2006", Prepared for Holyoke Gas and Electric by Normandeau Associates, Inc., Apr. 26, 2007, United States, 68 pages.

Odeh, "A Summary of Environmentally Friendly Turbine Design Concepts", DOE/ID/13741 Paper, Jul. 1999, United States, 47 pages.

Økland et al., "Recommendations on Size and Position of Surgically and Gastrically Implanted Electronic Tags in European Silver Eel", Animal Biotelemetry 1:6, 2013, United Kingdom, pp. 1-5.

Pacific Northwest National Laboratory, "JSATS Tag Downsize Project Progess Report", PNNL, Apr. 26, 2010, United States, 16 pages.

(56) References Cited

OTHER PUBLICATIONS

Pacific Northwest National Laboratory, "Juvenile Salmon Acoustic Telemetry System (JSATS) Acoustic Transmitters", PNNL, Mar. 2010, United States, 1 page.
Panther et al., "Influence of Incision Location on Transmitter Loss. Healing, Survival, Growth, and Suture Retention of Juvenile Chinook Salmon", Transactions of the American Fisheries Society 140, 2011, United States, pp. 1492-1503.
Platt et al., "The Use of Piezoelectric Ceramics for Electric Power Generation Within Orthopedic Implants", IEEE/ASME Transactions on Mechatronics vol. 10, No. 4, Aug. 2005, United States, pp. 455-461.
Richmond et al., "Response Relationships Between Juvenile Salmon and an Autonomous Sensor in Turbulent Flow", Fisheries Research vol. 97, 2009, Netherlands, pp. 134-139.
Rifai et al., "Modeling of Piezoelectric Tube Actuators", Dspace@MIT, available online at https://dspace.mit.edu/bitstream/handle/1721.1/3911/IMST014 pdf, 2004, 8 pages.
Summerfelt et al., "Anesthesia, Surgery, and Related Techniques", in Schreck, C.B., Moyle, P.B., (Eds.), Methods for Fish Biology American Fisheries Society, 1990, United States, pp. 213-272.
Verdon et al., "Recruitment of American Eels in the Richelieu River and Lake Champlain: Provision of Upstream Passage as a Regional-Scale Solution to a Large-Scale Problem", American Fisheries Society Symposium 33, 2003, United States, pp. 125-138.
Walker et al., "Effects of a Novel Acoustic Transmitter on Swimming Performance and Predator Avoidance of Juvenile Chinook Salmon: Determination of a Size Threshold", Fisheries Research 176, 2016, Netherlands, pp. 48-54.
Ward et al., "A Laboratory Evaluation of Tagging-Related Mortality and Tag Loss in Juvenile Humpback Chub", North American Journal of Fisheries Management 35, 2015, United States, pp. 135-140.
Wuenschel et al., "Swimming Ability of Eels (*Anguilla rostrata, Conger oceanicus*) at Estuarine Ingress: Contrasting Patterns of Cross-Shelf Transport?", Marine Biology 154, 2008, Germany, pp. 775-786.
Zale et al., "Effects of Surgically Implanted Transmitter Weights on Growth and Swimming Stamina of Small Adult Westslope Cutthroat Trout", Transactions of the American Fisheries Society vol. 134(3), 2005, United States, pp. 653-660.
WO PCT/US2020/021744 IPRP, dated Sep. 23, 2021, Battelle Memorial Institute.
Johannesson et al., "Fisheries Acoustics—A Practical Manual for Aquatic Biomass Estimation (Section 3)", Food and Agriculture Organization of the United Nations, Rome, available online at "https://www.fao.org/3/x5818e/x5818e04.htm#3.1.2transmitter", 1983, 27 pages.
WO PCT/US2014/053578 Inv-Pay Fees, dated Dec. 5, 2014, Bttelle Memorial Institute.
Deng et al., U.S. Appl. No. 62/267,738, filed Dec. 15, 2015, titled "Transmitters for Animals and Mehtods of Transmitting from Animals", 42 pages.
Eppard, "Juvenile Salmon Acoustic Telemtry System JSATS", Dec. 14, 2011, URL: http://www.nwcouncil.org/media/23478/jsats.pdf, pp. 1-13.
Erluck et al., "Underwater Thrust and Power Generation Using Flexible Piezoelectric Composites: An Experimental Investigation Toward Self-Powered Swimmer-Sensor Platforms", Smart Msterials and Structures vol. 20, 125013, 2011, United Kingdom, 11 pages.
Hwang et al., "Self-Powered Cardiac Pacemaker Enabled by Flexible Single Crystalline PMN-PT Piezoelectric Energy Harvester", Advanced Materials vol. 26, 2014, Germany, pp. 4880-4887.
Hwang et al., "Self-Powered Deep Brain Stimulation via a Flexible PIMNT Energy Harvester", Energy and Enviroment Science vol. 8, 2015, United Kingdom, pp. 2677-2684.
Lam et al., "Physical Characteristics and Rate Performance of $(CFx)_n$ ($0.33<x<0.66$) in Lithium Batteries", Journal of Power Sources vol. 153, 2006, Netherlands, pp. 354-359.
Li et al., "Design Parameters of a Miniaturized Piezoelectric Underwater Acoustic Transmitter", Sensors vol. 12, 2012, Switzerland, pp. 9098-9109.
Li et al., "Energy Harvesting from Low Frequency Applications using Piezoelectric Materials", Applied Physics Reviews 1, 0413301, 2014, United States, 20 pages.
Li et al., "Piezoelectric Materials Used in Underwater Acoustics Transducers" Sensor Letters vol. 10 (3/4), 2012, United States, pp. 679-697.
Li et al., "Piezoelectric Transducer Design for a Miniaturized Injectable Acoustic Transmitter", Smart Materials and Structures vol. 24, 115010, 2015, United Kingdom, 9 pages.

* cited by examiner

SENSOR ASSEMBLIES AND METHODS FOR EMULATING INTERACTION OF ENTITIES WITHIN WATER SYSTEMS

STATEMENT AS TO RIGHTS TO INVENTIONS MADE UNDER FEDERALLY-SPONSORED RESEARCH AND DEVELOPMENT

This invention was made with Government support under Contract DE-AC0576RL01830 awarded by the U.S. Department of Energy. The Government has certain rights in the invention.

CROSS REFERENCE TO RELATED APPLICATIONS

This application is related to U.S. patent application Ser. No. 14/871,761 filed Sep. 30, 2015, entitled "Autonomous Sensor Fish to Support Advanced Hydropower Development", now U.S. Pat. No. 10,067,112 issued Sep. 4, 2018, the entirety of which is incorporated by reference herein.

TECHNICAL FIELD

The present disclosure relates to sensor assemblies and methods for emulating interaction of entities within water systems. Water systems in relation to hydropower facilities is just one method of emulation.

BACKGROUND

Animals interact within water systems differently depending on the animal and the system. Modeling interactions of animal within water systems is important for many reasons, but recently, and significantly, it is important to determine the impact of water barriers such as dams, including hydropower dams, on animals such as fish. However, other systems, such as aqueducts, refurbished drainage, and/or aqueduct systems may be modeled as well.

In one particular example, it is important for many reasons to track or forecast fish passing through hydro-turbines or other hydraulic structures. Fish may be injured or killed when they are exposed to the severe hydraulic conditions found therein. Such conditions could include rapid and extreme pressure changes, shear stress and turbulence, strikes by runner blades and cavitation. In building new dams, and as existing turbines near the end of their operational life are set to be replaced, new designs for runners and other portions of the turbine system are being considered.

Studies using live fish are useful for the evaluation of dams' biological performance, but are limited in that they cannot determine the specific hydraulic conditions or physical stresses experienced by the fish, the locations where deleterious conditions occur, or the specific causes of the biological response. To overcome this deficiency, various other sensor devices have been developed. These devices can be released independently or concurrently with live fish directly into operating turbines or other passage routes as a means of measuring hydraulic conditions such as pressure, acceleration, and rotation acting on a body in situ during downstream passage.

While useful in their time, these types of devices have tended to lack the sufficient robustness required to survive the rapidly changing and extreme conditions within the testing sites. In addition, the speed at which conditions change made most of these sensors less useful because they were not able to acquire information in rapid fashion so as to give the true account of the significant changes that took place in the bodies of these fish as they passed through these environments. The size, functional limitations and problems with deployment and recovery, availability, and cost of these prior art devices have limited their use.

Desirable devices overcome some of these limitations; they can be more robust, cost accessible, capable of providing rapid data acquisition, widely deployable, and operable in more severe hydraulic conditions, including but not limited to high-head dams with Francis turbines and pump storage facilities.

The present disclosure provides assemblies and methods with more capabilities and applications that can facilitate the modeling of animal interaction with water systems, which provide for the development of environmentally advanced water systems such as dams and aqueducts. In addition, the present disclosure allows attachment of the system to the turbine blades, which provides understanding of machine dynamics to improve turbine design and operations.

Additional advantages and novel features of the assemblies and methods will be set forth as follows and will be readily apparent from the descriptions and demonstrations set forth herein. Accordingly, the following descriptions of the present assemblies and methods should be seen as illustrative of the assemblies and methods and not as limiting in any way.

SUMMARY OF THE DISCLOSURE

Sensor assemblies are provided for use in modeling water systems. These assemblies can include a circuit board supporting processing circuitry components on either or both opposing component support surfaces, along with a housing above the circuit board and the components, with the housing being circular about the circuit board in at least one cross section, and wherein the supporting surfaces of the circuit board are substantially parallel with the plane of the housing in the one cross section.

Methods for emulating interaction of entities within water systems are provided. The methods can include introducing a sensor assembly into a water system. The sensor assembly can include: a circuit board supporting processing circuitry components on either or both of opposing component support surfaces of the circuit board; a housing about the circuit board and the components, the housing being circular about the circuit board in at least one cross section; and wherein the support surfaces of the circuit board are substantially parallel with the plane of the housing in the one cross section.

Assemblies and methods of the present disclosure can provide improved robustness of design and enhanced measurement capabilities using innovative sensors and circuitry; reduced future costs and a model that is capable of deployment in numerous areas and/or water systems wherein such items were not previously deployable. The assemblies of the present disclosure can contain sensors for acceleration, rotation, magnetic field intensity, pressure, and temperature. A low-power microcontroller can collect data from the sensors and store the data in memory. A rechargeable battery can supply power to the assemblies. The assemblies can be nearly neutrally buoyant and thus mimic the behavior of water inhabiting species such as actual fish, thus in some applications, the sensor assemblies of the present disclosure can be considered sensor fish.

To operate the assembly, the user can activate the microcontroller using a magnet, and then drop the device in the water system (typically, on the upstream side of a dam in hydropower applications). The microcontroller can wait for a preselected and preprogrammed period of time and then sample data from each sensor at up to 8192 samples per second. Data collection can continue for a preselected programmable period of time, or until the memory is full. After collection from the water, the assembly can be configured for placement into a docking station wherein the data collected during the event can be downloaded into a larger system for analysis. The docking station can plug into the circuit board to recharge the battery and download the sensor data. After the data is downloaded the memory can be erased.

DRAWINGS

Embodiments of the disclosure are described below with reference to the following accompanying drawings.

DESCRIPTION

This disclosure is submitted in furtherance of the constitutional purposes of the U.S. Patent Laws "to promote the progress of science and useful arts" (Article 1, Section 8).

Figure 1A:
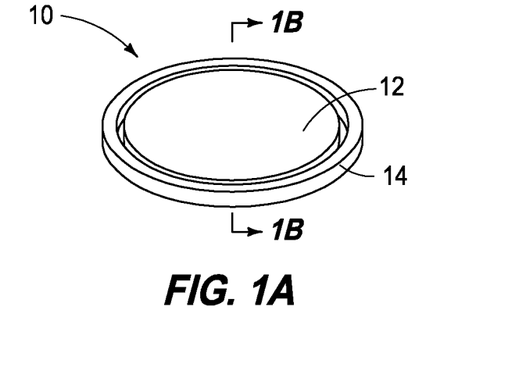
FIGS. 1A and 1B are representations of a portion of sensor assemblies according to an embodiment of the disclosure.

Referring first to FIG. 1A, at least one perspective view of a portion of a sensor assembly 10 is shown. In accordance with example implementations, sensor assembly 10 can include a circuit board 12 that is aligned in relation to housing 14. As shown, housing 14 can be substantially cylindrical in this view, and circuit board 12 may likewise be substantially cylindrical. In accordance with example implementations, the perimeter of circuit board 12 may compliment the cylindrical housing 14.

Figure 1B:
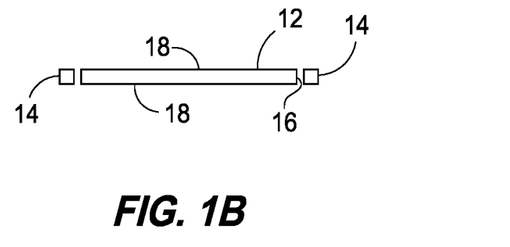

Referring next to FIG. 1B, housing 14 is shown in one cross section in relation to circuit board 12. As can be seen in this one cross section, perimeter plane 16 of circuit board 12 can be substantially parallel with perimeter plane 17 of housing 14. Further, opposing surfaces 18 of circuit board 12 can extend along a plane that is substantially normal to perimeter plane 17.

Figure 2A:
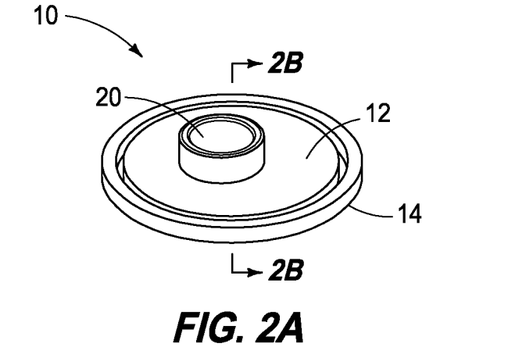
FIGS. 2A and 2B are additional representations of sensor assemblies according to embodiments of the disclosure.
Figure 2B:
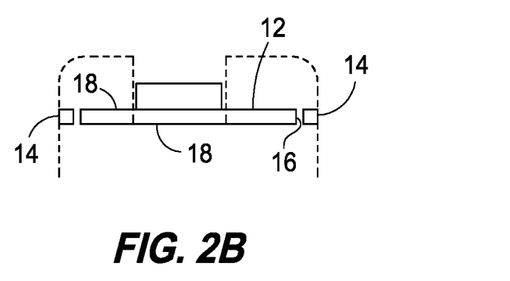
Figure 3A:
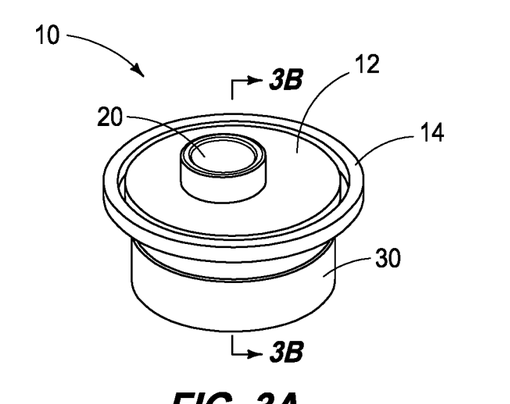
FIGS. 3A and 3B are even more additional representations of sensor assemblies according to embodiments of the disclosure.
Figure 3B:
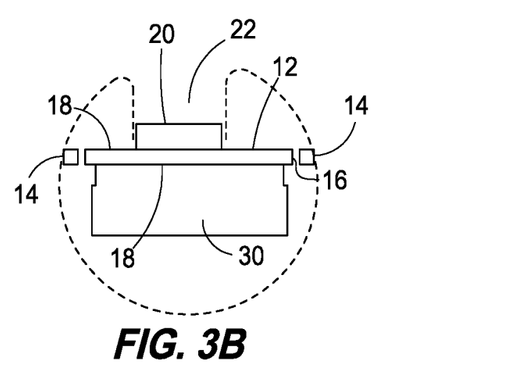

Referring next to FIGS. 2A and 2B, pressure sensor component 20 is shown in relation to circuit board 12 and housing 14. As shown, pressure sensor component 20 can reside within a recess 22 of housing 14. Referring next to FIGS. 3A and 3B, power source or battery 30 can be operatively aligned in relation to circuit board 12, on the opposing side of pressure sensor component 20, for example.

Figure 4:
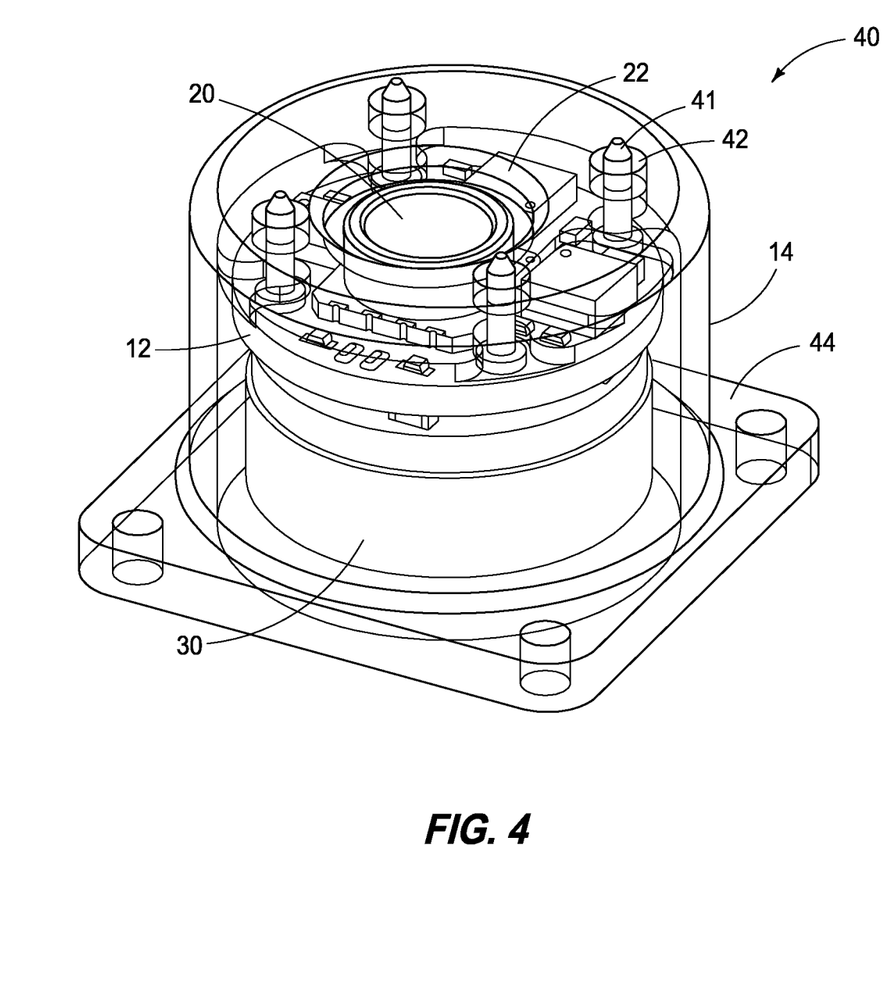
FIG. 4 is at least one view of a sensor assembly according to an embodiment of the disclosure.

Referring next to FIG. 4, an isometric view of at least one sensor assembly 40 is shown that includes housing 14 about circuit board 12, with circuit board 12 supporting processing circuitry components including pressure sensor component 20 within recess 22. Additionally, pins 41 can extend through recesses 42. Pins 41 can be configured as an interface with processing circuitry components of sensor assembly 40. Further, power supply 30 such as a battery can be provided within housing 14 below circuit board 12 and opposing pressure sensor component 20. In this particular embodiment, sensor assembly 40 can include a base 44.

Figure 5:
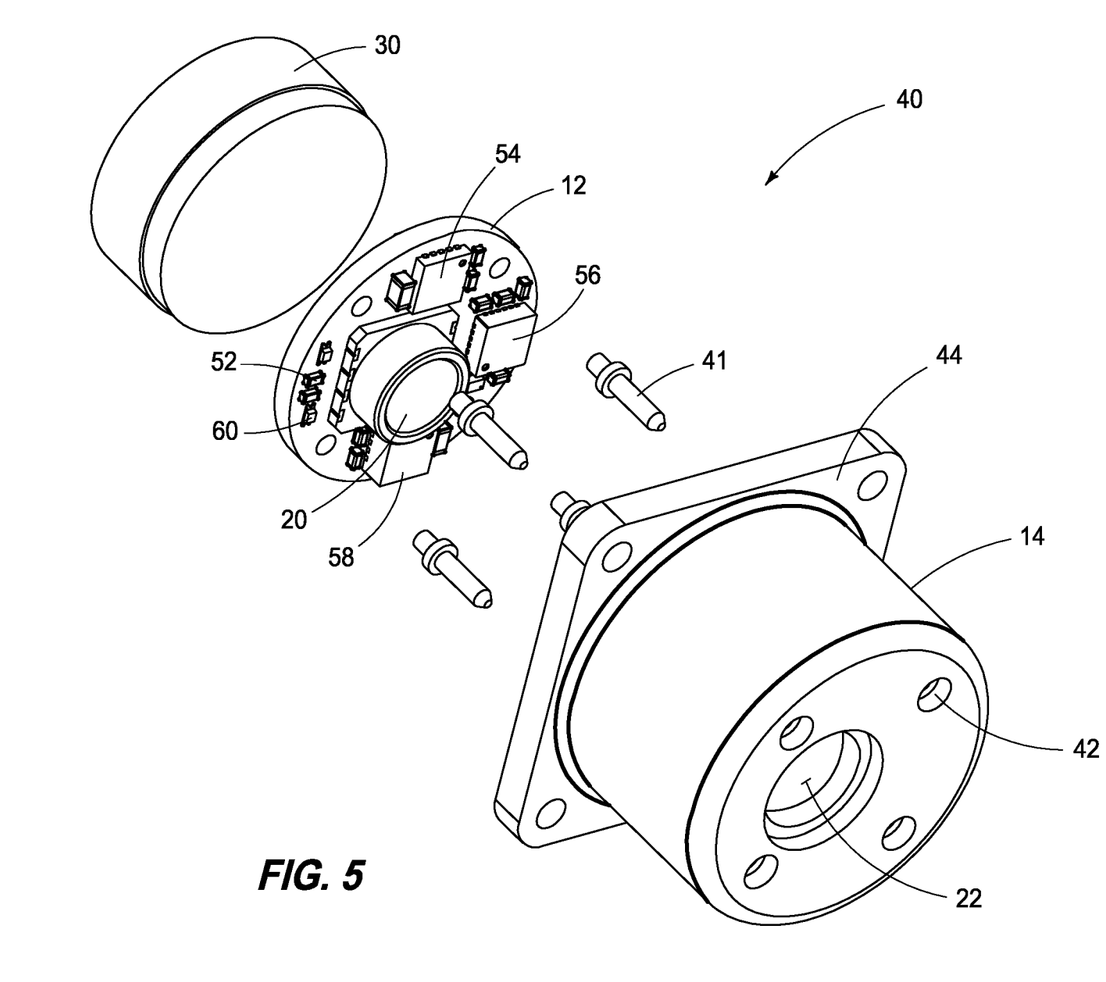
FIG. 5 is an exploded view of the sensor assembly of FIG. 4 according to an embodiment of the disclosure.
Figure 6:
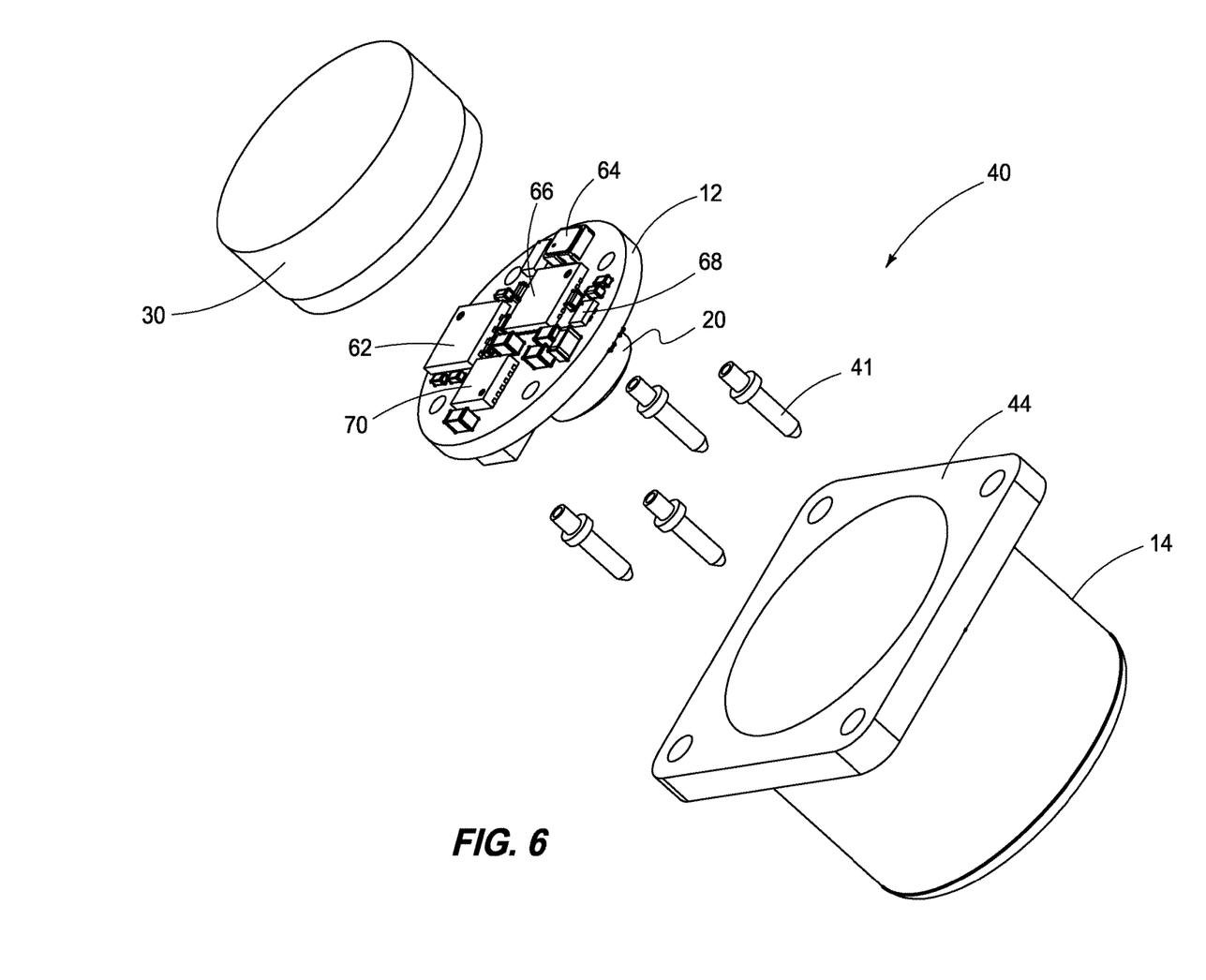
FIG. 6 is an alternative view of an exploded view of sensor assemblies of FIGS. 4 and 5 according to an embodiment of the disclosure.

Referring next to FIGS. 5 and 6, alternative exploded views of sensor assembly 40 are shown that include circuit board 12 supporting pressure sensor component 20 above power source 30. Sensor assembly 40 can include light indicators 52 such as a green LED indicator. This indicator can be utilized to provide visual confirmation of the sensor assembly status, for example.

Additionally, sensor assembly 40 can include an amplifier 54 as well as a nine-axis inertial measurement component 56 and an accelerometer component 58. Amplifier 54 can be a pressure sensor amplifier component. The pressure sensor amplifier circuitry component can be a single component, and may occupy less than 3 mm×3 mm in area in all cross sections.

Additional light indicators can be provided as well. Accordingly, light indicator 60 can be provided as a blue LED, for example. In accordance with example implementations, housing 14 can be transparent or at least sufficiently translucent to allow for the viewing of the light indicators within sensor assembly 40.

Referring next to FIG. 6, on an alternate surface of circuit board 12 can be battery charger component 70, a memory component 62 such as a 64-megabit flash memory component, an oscillator component 64, a microcontroller 66, and a magnetic sensor component 68. As can be seen, assembly 40 can be within a substantially tubular housing having substantially planar ends. However, unlike the prior art sensor assemblies, the opposing surfaces of the circuit board are placed normal to the circular edges of the housing in at least one cross section.

According to example implementations, assembly 40 may have a height of 13.5 mm and a diameter of 18 mm in at least one cross section. Assembly 40 can occupy a volume of less than 3.76 cm3, and have a weight of less than 6.2 grams. Further, base 44 can be configured to be coupled to a flat rigid surface, e.g., a hydro turbine.

Figure 7:
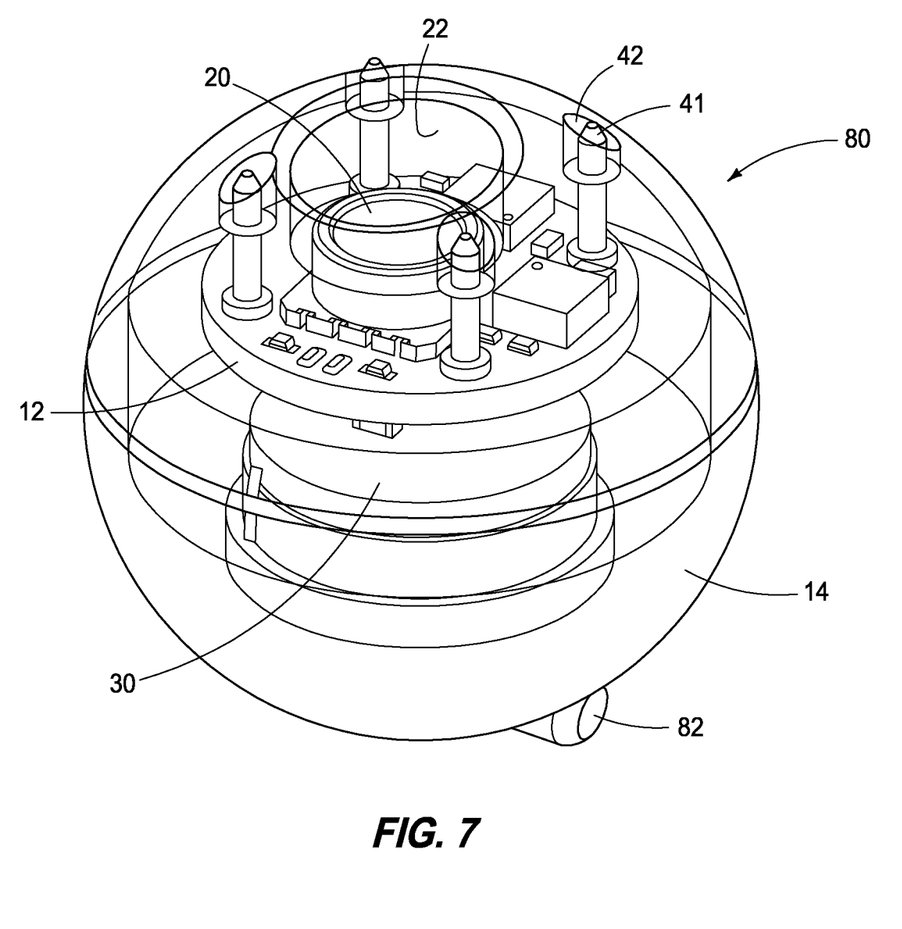
FIG. 7 is a view of a sensor assembly according to an embodiment of the disclosure.

Referring next to FIG. 7, in accordance with another example implementation, sensor assembly 80 is shown that includes housing 14 about circuit board 12. In accordance with example implementations, housing 14 is substantially spherical and includes openings 42 and 22 to receive pins 41 and pressure sensor components 20. Additionally, assembly 80 can include a recess 82 configured to receive a self-inflating balloon.

Figure 8:
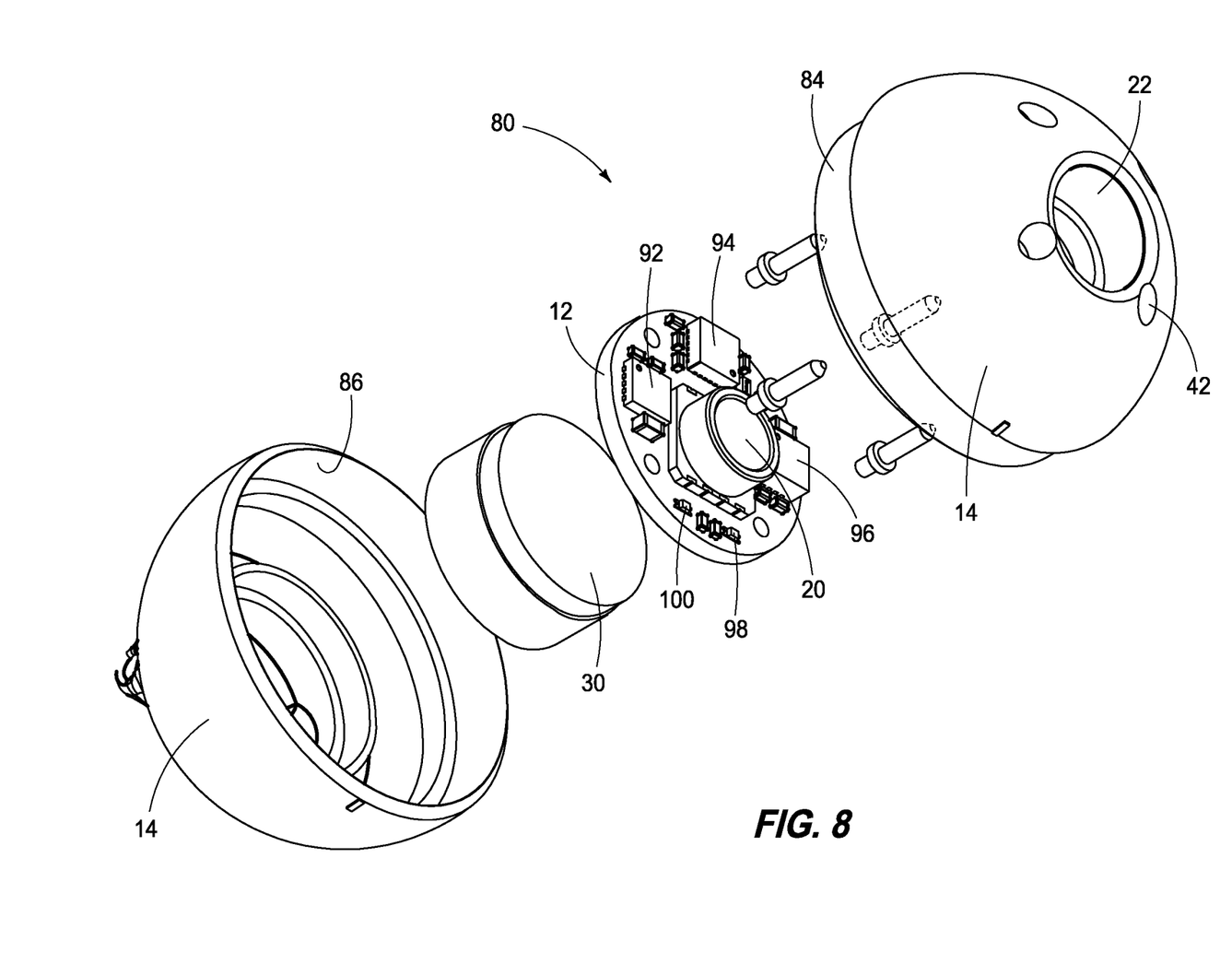
FIG. 8 is an exploded view of the sensor assembly of FIG. 7 according to an embodiment of the disclosure.
Figure 9:
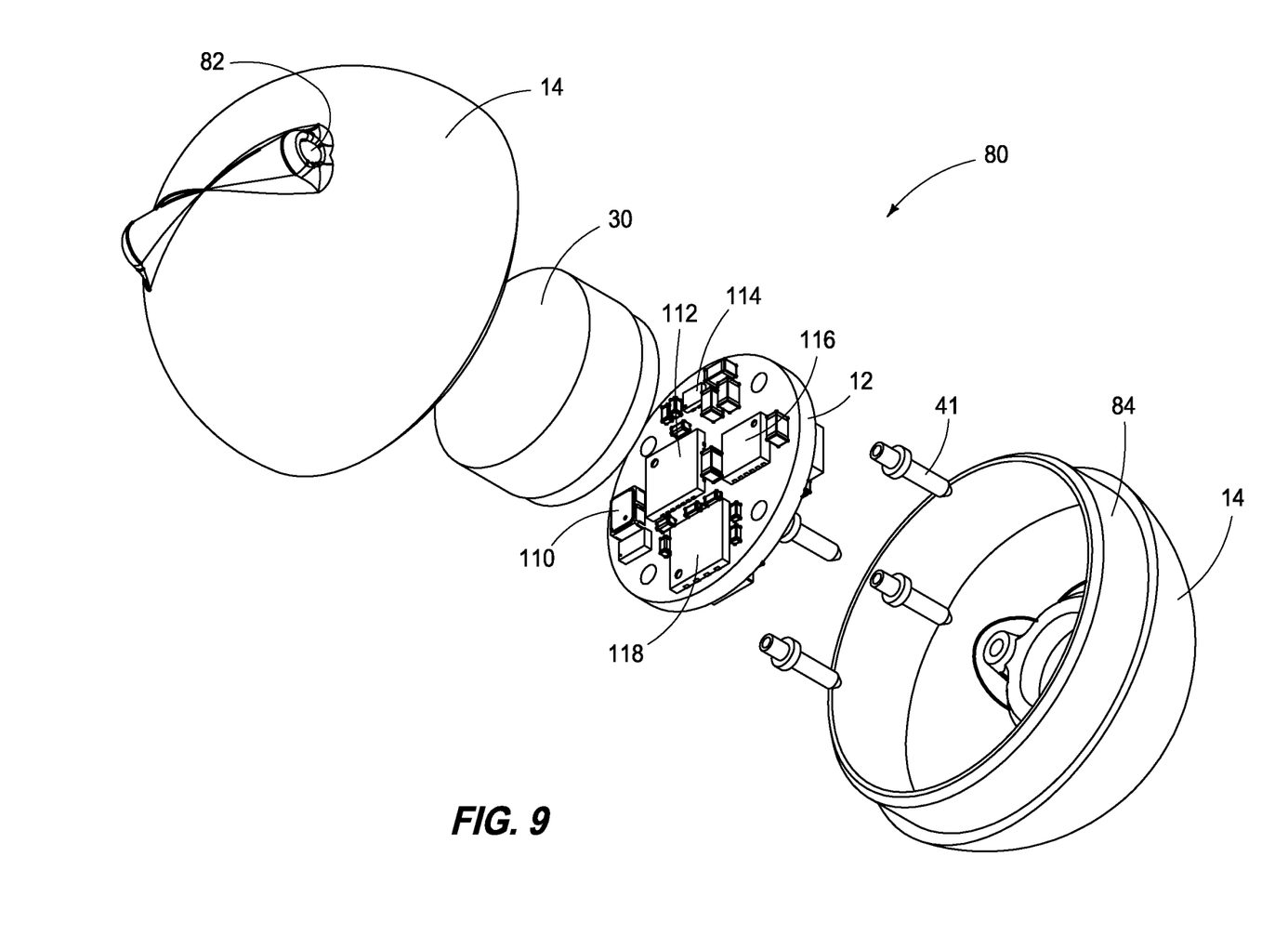
FIG. 9 is an alternative exploded view of the sensor assemblies of FIGS. 7 and 8 according to an embodiment of the disclosure.

Referring next to FIGS. 8 and 9, and first with respect to FIG. 8, assembly 80 is shown in an exploded view with housing 14 in two components that can be considered a bottom half and an upper half of the substantially spherical housing 14. In accordance with example implementations, at least one of the halves can have an extension 84 that is configured to be received by a recess or complimentary portion 86, allowing for a relatively sealed joining of the both top and bottom halves of housing 14. In accordance with example implementations, assembly 80 can include an amplifier 92 as well as a nine-axis inertial measurement unit 94 and an accelerometer component 96 as well as status indicating components 100 and 98 that may be represented as green and blue LEDs, respectively. Referring next to FIG. 9, on the opposing face of circuit board 12 can be a oscillator component 110 as well as a microcontroller 112, a magnetic sensor component 114 as well as a battery charger component 116 and a memory component such as a 64-megabit flash memory component 118.

According to example implementations, assembly 80 may have a maximum cross sectional diameter of 23.2 mm. Assembly 80 can occupy a volume of less than 6.38 cm3, and have a weight of less than 6.4 grams.

Figure 10:
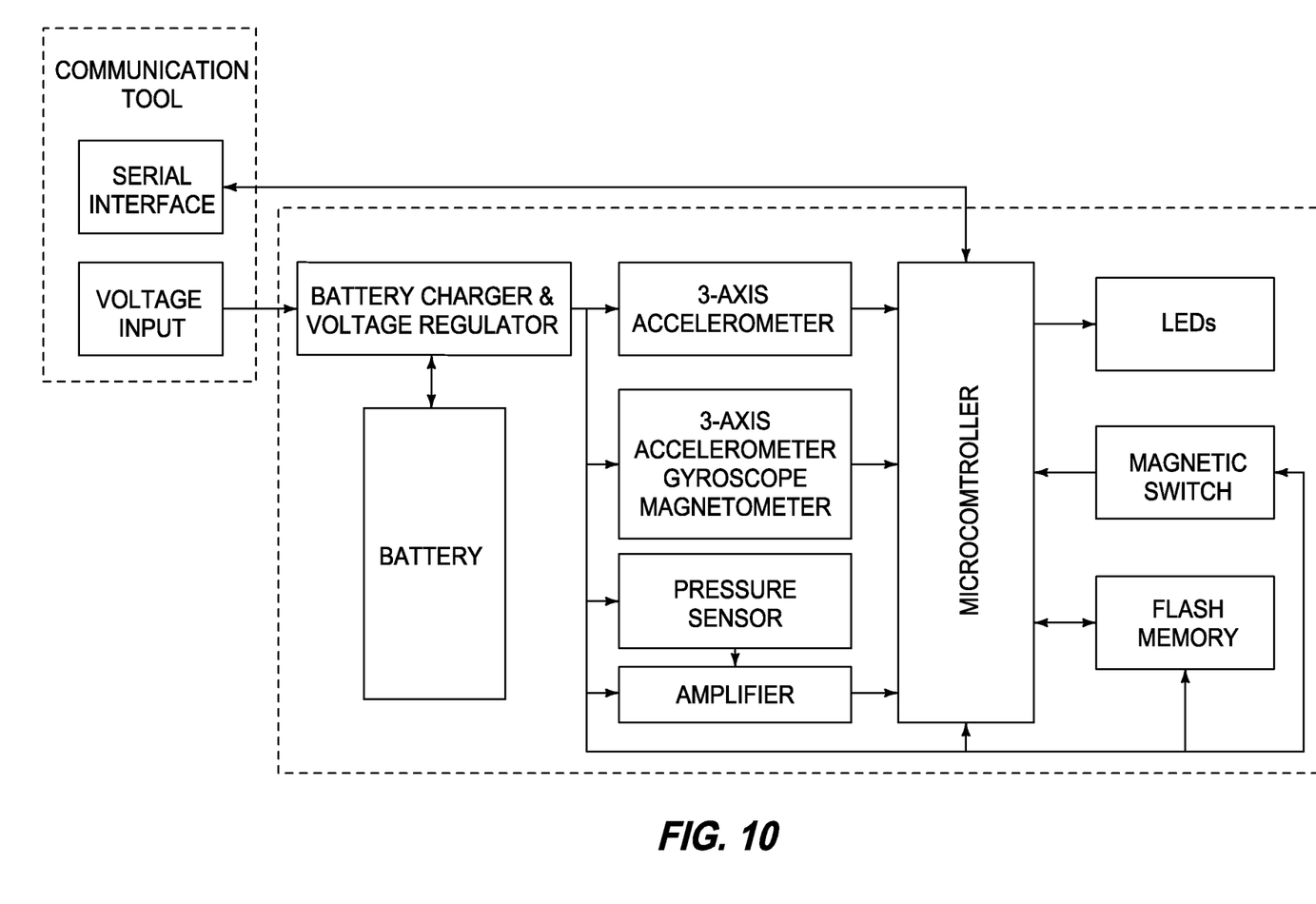
FIG. 10 is a is a block diagram of electrically connected components of at least one assembly of the present disclosure.

Referring lastly to FIG. 10, the electronics design of at least one of the sensor assemblies is shown in an overall block diagram. The design may contain one main circuit board that includes a microcontroller. This board is aligned as described above within housing 14 with the battery mounted within housing 14. The board and components of the assembly can be operably coupled to communication tool that includes serial download interface, and input to the battery charger. This communication tool can facilitate connection with or be a part of a docking station, not shown.

Power to the device can be provided by the battery which can be a lithium polymer battery. Example battery specifications can be, but are not limited to that of a CoinPower® CP 1254 A2 battery having a diameter: 12.1 mm, height: 5.4 mm, weight: 1.6 g, and capacity: 50 mAh. An integrated protection circuit cuts off the battery on an over-discharge condition.

A 3-axis accelerometer analog component with a typical full-scale range of ±200 g can be operationally coupled between the battery and the microcontroller. An example ADXL377 can be used; this particular component has approximate dimensions of 3×3×1.45 mm.

A nine—axis inertial measurement unit can also be operationally coupled between the battery and the microcontroller. This component may contain a 3-axis accelerometer, 3-axis gyroscope, and 3-axis magnetometer. An example InvenSense: MPU-9250; this particular component has approximate dimensions of 3×3×1 mm, has a shock tolerance of 10,000 g, consumes a supply current of 3.5 mA during operation, and includes an internal temperature sensor. For acceleration 16 g in operational range each axis can be achieved with 16 bits of precision. For rotation 2000°/s operational range in each axis can be achieved with 16 bits of precision. For magnetic sensing 4800 uT operational range in each axis can be achieved with 14 bits of precision. A sampling rate of 2048 samples per second can be achieved.

The pressure sensor can be an analog component with an operational range of 12 bar (174 psia). The positive and negative outputs may connect to the amplifier component before operationally coupling with the microcontroller. Example pressure sensors can include Measurement Specialties: MS5412BM with approximate dimensions of 6.2× 6.4×2.88 mm. Example amplifiers include the LT1991 with approximate dimensions of 3×3 mm.

The microcontroller component may be a Microchip: PIC24FJ64GA702 that includes: 2 I²C modules; 2 SPI modules; 2 UART modules; 12-bit and 200 ksps ADC; 64 kB Flash Program Memory; and 12 kB RAM. This component has approximate dimensions of 4×4×0.6 mm.

The memory component can be a Cypress: S25FL064LABNFl043 with capacity of 64 megabits and approximate dimensions of 4×4 mm.

To activate the device a magnetic sensor component can be operationally coupled to the microcontroller. In one embodiment, the magnetic sensor can be a Hall effect sensor. The magnetic sensor component can occupy 1.1×1.4 mm in all cross sections. The user may activate the sensor assembly by holding a magnet near the magnetic sensor. The output of the magnetic sensor may drive an interrupt pin of the microcontroller. LED lights may blink to indicate the system status.

The microcontroller can also activate an integrated RF beacon which generates a carrier signal, and drives an antenna. While the present embodiment is shown, it is to be understood that various other alternative embodiments are contemplated within the scope of the claims of the present application.

A docking station, not shown, can be used to charge the battery via power and ground connections on the download board, and downloads data from the microcontroller component. The data transfer may use RS-232 at 921.6 kHz baud rate, but with 3.0 V logic levels. The docking station may use a commercial TTL-to-USB converter cable or similar circuitry to pass the data to a personal computer. When the sensor assembly is placed in the docking station, the RS-232 signals may be pulled high to wake the microcontroller component from sleep mode.

The microcontroller component may contain firmware which provides the logic for operating the sensor assembly, whereas the other modules define the interfaces to various components with the necessary initialization routines. As stated above, the U.S. patent application Ser. No. 14/871,761 filed Sep. 30, 2015, entitled "Autonomous Sensor Fish to Support Advanced Hydropower Development", now U.S. Pat. No. 10,067,112 issued Sep. 4, 2018, is incorporated by reference herein, and can be relied upon for additional processing circuitry and execution detail.

In compliance with the statute, embodiments of the invention have been described in language more or less specific as to structural and methodical features. It is to be understood, however, that the entire invention is not limited to the specific features and/or embodiments shown and/or described, since the disclosed embodiments comprise forms of putting the invention into effect. The invention is, therefore, claimed in any of its forms or modifications within the proper scope of the appended claims appropriately interpreted in accordance with the doctrine of equivalents.

The invention claimed is:

1. A sensor assembly for use in modeling water systems, the assembly comprising:
   a substrate defining a disk, the disk having opposing surfaces and a continuous circular edge between the two surfaces;
   processing circuitry operatively coupled to each of the opposing surfaces, the substrate and processing circuitry defining a circuit board;
   a sensor component as part of the processing circuitry and operatively engaged with one of the opposing surfaces of the substrate of the circuit board; and
   a housing about and complimenting the circular edge of the substrate of the circuit board, the housing being circular about the circuit board in at least one cross section, the housing extending between opposing ends, each of the ends receiving processing circuitry operatively coupled to each of the opposing surfaces of the substrate of the circuit board, wherein one of the ends of the housing receives the processing circuitry of the one opposing surface, the one end of the housing defining a recess configured to receive the sensor.

2. The assembly of claim 1 wherein at least a portion of the housing defines a tube.

3. The assembly of claim 2 wherein the tubular housing defines opposing ends of the tube, and each of the opposing component support surfaces face the opposing ends of the tube.

4. The assembly of claim 3 wherein the sensor component defines surfaces extending to perimeter walls, the sensor surfaces being parallel with the opposing component support surfaces.

5. The assembly of claim 1 wherein the housing defines a sphere.

6. The assembly of claim 5 wherein the sphere defines the opposing ends.

7. The assembly of claim 6 wherein at least one of the opposing ends of the sphere is configured to facilitate coupling to another object.

8. The assembly of claim 1 wherein the housing defines an internal volume of less than 3.76 cm$^3$.

9. The assembly of claim 1 wherein the housing defines opposing ends having distance there between of less than 23 mm in at least one cross section.

10. The assembly of claim 1 further comprising a single component magnetometer.

11. The assembly of claim 1 wherein the pressure sensor component comprises pressure sensor amplifier circuitry.

12. The assembly of claim 11 wherein the pressure sensor amplifier circuitry is a single component.

13. The assembly of claim 11 wherein the pressure sensor amplifier circuitry is less than 3 mm×3 mm in area in all cross sections.

14. The assembly of claim 1 further comprising a magnetic sensor component.

15. The assembly of claim 14 wherein the magnetic sensor component is less than 1.1 mm×1.4 mm in area in at least one cross section.

16. The assembly of claim 15 further comprising a base configured to attach to hydroelectric turbine blades.

* * * * *